United States Patent
Choi

(10) Patent No.: US 8,558,608 B2
(45) Date of Patent: Oct. 15, 2013

(54) POLY SILICON RESISTOR, REFERENCE VOLTAGE CIRCUIT COMPRISING THE SAME, AND MANUFACTURING METHOD OF POLY SILICON RESISTOR

(75) Inventor: Jung-Hyun Choi, Incheon (KR)

(73) Assignee: Fairchild Korea Semiconductor Ltd., Bucheon (KR)

( * ) Notice: Subject to any disclaimer, the term of this patent is extended or adjusted under 35 U.S.C. 154(b) by 0 days.

(21) Appl. No.: 13/559,218

(22) Filed: Jul. 26, 2012

(65) Prior Publication Data

US 2013/0033309 A1    Feb. 7, 2013

(30) Foreign Application Priority Data

Aug. 1, 2011    (KR) .................. 10-2011-0076723

(51) Int. Cl.
  *H01L 25/00*    (2006.01)
(52) U.S. Cl.
  USPC ............ 327/565; 327/512; 327/538; 257/380
(58) Field of Classification Search
  USPC ......... 327/574, 564, 565, 566, 362, 378, 498, 327/512, 538; 257/380, 904
  See application file for complete search history.

(56) References Cited

U.S. PATENT DOCUMENTS

| | | | | |
|---|---|---|---|---|
| 5,434,533 | A * | 7/1995 | Furutani | 327/538 |
| 5,795,069 | A * | 8/1998 | Mattes et al. | 374/183 |
| 6,351,111 | B1 * | 2/2002 | Laraia | 323/315 |
| 6,412,977 | B1 * | 7/2002 | Black et al. | 374/178 |
| 6,504,424 | B1 * | 1/2003 | Heminger et al. | 327/566 |
| 6,717,457 | B2 * | 4/2004 | Nanba et al. | 327/513 |
| 6,778,000 | B2 * | 8/2004 | Lee et al. | 327/362 |
| 7,250,796 | B2 * | 7/2007 | Hidaka et al. | 327/112 |
| 2004/0075507 | A1 * | 4/2004 | Aoyama et al. | 331/176 |
| 2007/0146065 | A1 * | 6/2007 | Yoshizawa et al. | 330/9 |
| 2010/0259315 | A1 * | 10/2010 | Lin | 327/538 |

* cited by examiner

*Primary Examiner* — Lincoln Donovan
*Assistant Examiner* — Jung H. Kim
(74) *Attorney, Agent, or Firm* — Okamoto & Benedicto LLP

(57) ABSTRACT

The present invention relates to a polysilicon resistor, a reference voltage circuit including the same, and a method for manufacturing the polysilicon resistor. The polysilicon resistor according includes a first polysilicon resistor and at least one of second polysilicon resistors, coupled to the first polysilicon resistor in series. The first polysilicon resistor and the at least one of the second polysilicon resistors are P-type polysilicon, and a doping concentration of the first polysilicon resistor is different from a doping concentration of the at least one of the second polysilicon resistors. The polysilicon resistor formed by serially coupling the first polysilicon resistor and the at least one of the second polysilicon resistors is applied with a constant current such that a reference voltage or a constant voltage is generated.

12 Claims, 8 Drawing Sheets

POLY SILICON RESISTOR, REFERENCE VOLTAGE CIRCUIT COMPRISING THE SAME, AND MANUFACTURING METHOD OF POLY SILICON RESISTOR

CROSS-REFERENCE TO RELATED APPLICATION

This application claims priority to and the benefit of Korean Patent Application No. 10-2011-0076723 filed in the Korean Intellectual Property Office on Aug. 1, 2011, the entire contents of which are incorporated herein by reference.

BACKGROUND OF THE INVENTION (a) Field of the Invention

The present invention relates to a polysilicon resistor, a reference voltage circuit including the same, and a method for manufacturing the polysilicon resistor.

(b) Description of the Related Art

A resistor has a resistance value that varies according to increase/decrease of the resistor. A conventional resistor formed using doped polysilicion, that is, a polysilicon resistor has a resistance value variation characteristic (i.e., a temperature characteristic of the resistor) according to temperature variation, and the temperature characteristic of the resistor is changed according to a doping type.

For example, the resistance value may be decreased as the temperature increases when a polysilicon layer is N-type doped, and the resistance value may be increased as the temperature increase when the polysilicon layer is P-type doped.

This causes a reference voltage value of a bandgap reference circuit that generates a predetermined level of a reference voltage to be increased or decreased according to a temperature.

In addition, a BJT circuit is additionally provided in the bandgap reference circuit to compensate the variation of the reference voltage value of the bandgap reference circuit, thereby causing an increase of cost and size.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to prevent resistance variation and reference voltage variation according to temperature variation.

A polysilicon resistor according to an exemplary embodiment of the present invention includes a first polysilicon resistor and at least one of second polysilicon resistors, coupled to the first polysilicon resistor in series. The first polysilicon resistor and the at least one of the second polysilicon resistors are P-type polysilicon, and a doping concentration of the first polysilicon resistor is different from a doping concentration of the at least one of the second polysilicon resistors.

The polysilicon resistor further includes a substrate and first and second oxide layers formed on the substrate, the first polysilicon resistor includes first gate polysilicon formed on the first oxide layer, and one of the at least one of the second polysilicon resistors includes second gate polysilicon formed on the second oxide layer.

A doping concentration of the first gate polysilicon is different from a doping concentration of the second gate polysilicon. An area of the first gate polysilicon, doped with P-type impurities and an area of a region of the second gate polysilicon, doped with the P-type impurities are different from each other.

The polysilicon resistor further includes first and second contacts formed on the first gate poly region and third and fourth contacts formed on the second gate poly region.

The region of the first gate polysilicon, doped with the P-type impurities is a region corresponding to the first and second contacts.

The polysilicon resistor further includes a first metal electrode formed on the second and third contacts and connecting the second contact and the third contact with each other. The polysilicon resistor further includes a second metal electrode formed on the first contact and connected to the first contact and a third metal electrode formed on the fourth contact and connected to the fourth contact.

The width of the first metal electrode is greater than the width of each of the second and third contacts, the width of the second metal electrode is greater than the width of the first contact, and the width of the third metal electrode is greater than the width of the fourth contact.

A temperature characteristic of the first polysilicon resistor and a temperature characteristic of the at least one of the second polysilicon resistors are opposite to each other.

A method for manufacturing a polysilicon resistor according to another exemplary embodiment of the present invention includes: forming polysilicon on an oxide layer that is formed on a substrate; dividing the polysilicon into a first polysilicon region and a second polysilicon region; and doping the first polysilicon region and the second polysilicon region. A doping concentration of the first polysilicon region and a doping concentration of the second polysilicon region are different from each other.

An area of the doped region of the first polysilicon region and an area of the doped region of the second polysilicon region are different from each other. A temperature characteristic of the first polysilicon region by the doping concentration of the first polysilicon region and a temperature characteristic of the second polysilicon region by the doping concentration of the second polysilicon region are opposite to each other.

The doping of the first polysilicon region and the second polysilicon region includes doping with P-type impurities.

A reference voltage circuit according to another exemplary embodiment of the present invention includes: a transistor connected to a power source voltage and supplying a predetermined current and a polysilicon resistor generating a reference voltage according to a current flowing to the transistor. The polysilicon resistor includes a first polysilicon resistor and at least one of second polysilicon resistors, coupled to the first polysilicon resistor in series. The first polysilicon resistor and the at least one of the second polysilicon resistors are P-type polysilicon, and a doping concentration of the first polysilicon resistor is different from a doping concentration of the at least one of the second polysilicon resistors.

A temperature characteristic of the first polysilicon resistor and a temperature characteristic of the at least one of the second polysilicon resistors are opposite to each other.

According to the exemplary embodiments of the present invention, a polysilicon resistor of which resistance value variation with respect to temperature variation is decreased and a method for manufacturing the polysilicon resistor and be provided, and the polysilicon resistor and the method can be used in a reference voltage or constant voltage source generation circuit.

In addition, a standard deviation of the resistor according to an area can be improved compared to a conventional resistor.

DETAILED DESCRIPTION OF THE EMBODIMENTS

Figure 1:
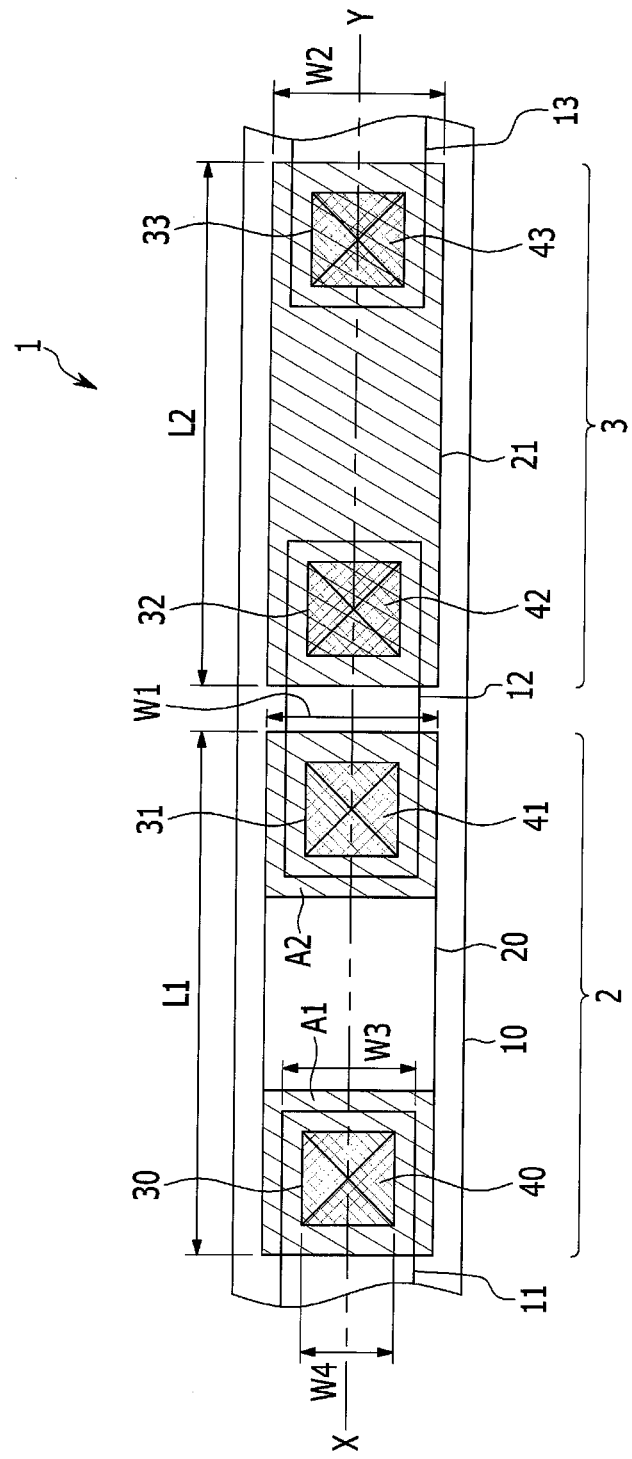
FIG. 1 is a plan view of a resistor according to an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising", will be understood to imply the inclusion of stated elements but not the exclusion of any other elements. Further, unless explicitly described to the contrary, another layer or film formed between layers and between a film and a layer will be understood to imply not the exclusion of the other layer or film.

Hereinafter, the present invention will be described more fully hereinafter with reference to the accompanying drawings, in which exemplary embodiments of the invention are shown.

A resistor according to an exemplary embodiment of the present invention is a resistor formed of polysilicon, and can significantly reduce an influence according to temperature variation. The resistor may be used in a reference voltage circuit such that a predetermined level of a reference voltage that is not influenced by the temperature variation can be generated.

A temperature characteristic can be controlled by adjusting a doping concentration of a polysilicon resistor. In further detail, a resistor that is independent to temperature variation can be realized by matching two polysilicon resistors respectively having different doping concentrations using P-type impurities. A mechanism realized by a conventional BJT may be replaced with a resistor according to an exemplary embodiment of the present invention.

FIG. 1 is a plan view of a resistor according to an exemplary embodiment of the present invention.

As shown in FIG. 1, a polysilicon resistor 1 includes a P minus (P–) poly resistor 2 formed on a substrate 10 and a P plus (P+) poly resistor 3.

The P– poly resistor 2 and the P+ poly resistor 3 are coupled in series through a metal electrode 12, and are formed on the substrate 10. The P– poly resistor 2 is connected to a metal electrode 11 and may be connected with another element through the metal electrode 11, and the P+ poly resistor 3 is connected to a metal electrode 13 and may be coupled with another P+ poly resistor in series through the metal electrode 13.

The P– poly resistor 2 includes gate polysilicon 20 and two contacts 40 and 41. The gate polysilicon 20 includes a first doping region A1 and a second doping region A2 which are doped with P-type impurities. The gate polysilicon 20 and each of the two contacts 40 and contact 41 are connected through contact holes 30 and 31. The metal electrode 11 is connected to the contact 40.

The P+ poly resistor 3 includes gate polysilicon 21 and two contacts 42 and 43. The gate polysilicon 21 is wholly doped with the p-type impurite. The gate polysilicon 21 and each of the two contacts 42 and 43 are connected with each other through a contact hole 32 and a contact hole 32. The metal electrode 13 is connected to the contact 43.

The metal electrode 12 is connected to the contact 41 and the contact 42.

Figure 2:
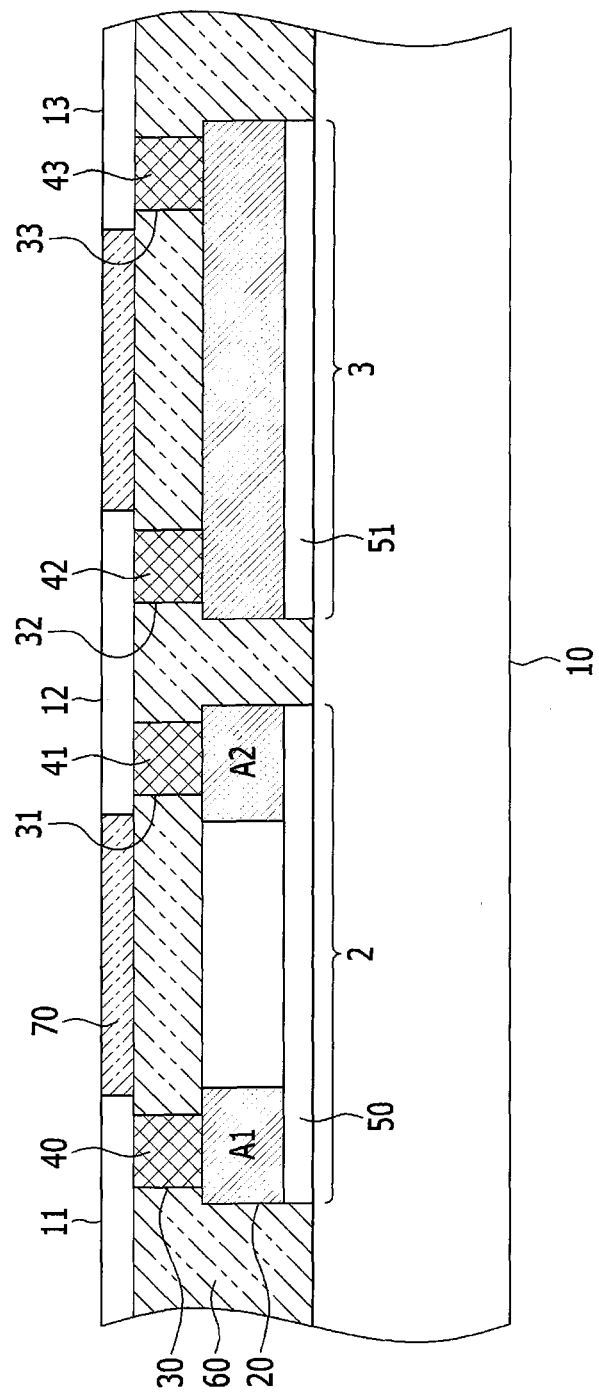
FIG. 2 is a cross-sectional view of the resistor of FIG. 1, taken along the line X-Y.

FIG. 2 is a cross-sectional view of the resistor of FIG. 1 according to the exemplary embodiment of the present invention, taken along the line X-Y.

As shown in FIG. 2, oxide layers (SiO$_2$) 50 and 51 are formed on the substrate 10.

The gate polysilicon 20 is formed on the oxide layer 50. The gate polysilicon 21 is formed on the oxide layer 51.

The oxide layer is formed on the substrate 10, and the gate polysilicon is formed on the oxide layer. A photoresister is layered on the gate polysilicon, and a pattern is formed by exposing the photoregister.

A region where the oxide layer 50 and the gate polysilicon 20 are layered and a region where the oxide layer 51 and the gate polysilicon 21 are layered are patterned, and other regions are exposed. After the patterns are formed, the region where the oxide layer 50 and the gate polysilicon 20 are layered and the region where the oxide layer 51 and the gate polysilicon 21 are layered only remain through an etching process, as shown in FIG. 2.

The gate polysilicon 20 and the gate polysilicon 21 are doped with the P-type impurities. Only first and second doping regions A1 and A2 are doped in the gate polysilicon 20, and the gate polysilicon 21 is wholly doped with the P-type impurities.

After the gate polysilicon 20 and 21 are being doped, a first insulating layer 60 (the regions marked by the two-dot dash lines) is formed on and between the gate polysilicons 20 and 21. Thus, as shown in FIG. 2, the first insulation layer 60 is formed between the oxide layer 50 and the oxide layer 51 and between and above the gate polysilicon 20 and the gate polysilicon 21.

The contact holes 30, 31, 32, and 33 are formed by etching the first insulation layer 60 such that the contacts 40, 41, 42, and 43 are formed. The contacts 40, 41, 42, and 43 may be formed by gap-filling the contact holes 30, 31, 32, and 33 with a metal material.

After the contacts 40, 41, 42, and 43 are formed, a second insulating layer 70 (i.e., regions marked by one-dot dashed lines) is formed on the contacts 40, 41, 42, and 43 and the first insulation layer 60. regions where the contacts 40, 41, 42, and 43 and the metal electrodes 11, 12, and 13 contact each other in the second insulation layer 70 are etched. The metal electrodes 11, 12, and 13 are formed in the etched regions.

The gate polysilicon implies poly silicon formed as a gate electrode during a semiconductor process. In the exemplary embodiment of the present invention, gate poly silicon is used to form a polysilicon resistor. However, the present invention is not limited thereto, and a polysilicon resistor can be formed irrelevant to forming of the gate electrode.

As shown in FIG. 1 and FIG. 2, a width W3 of the metal electrode 11 is wider than a width W4 of the contact 40. Widths of the metal electrode 12 and the metal electrode 13 are wider that widths of the corresponding contacts 41, 42, and 43.

Areas of the metal electrodes 11, 12, and 13 contacting the corresponding contacts 40, 41, 42, and 43 have margins. Then, increase of resistance that may cause because the metal electrodes 11, 12, and 13 do not overlap the corresponding contacts 40, 41, 42, and 43 can be prevented.

A resistance value of the polysilicon resistor according to a temperature of the polysilicon can be as given in Equation 1.

$$R(T)=R(T_0)\cdot[1+TCR1\cdot(T-T_0)+TCR2\cdot(T-T_0)^2] \quad \text{(Equation 1)}$$

$R(T_0)$ is a resistance value of the polysilicon resistor at $T_0$ degrees Celsius, TCR1 is a linear temperature coefficient, TCR2 is a secondary temperature coefficient, and $T_0$ is a reference temperature. In the present exemplary embodiment, $T_0$ is 25 degrees Celsius.

$R(T_0)$, TCR1, and TCR2 are determined according to a characteristic of a resistor, and $R(T_0)$ are unique values determined by a doping concentration of polysilicon, widths W1 and W2, and lengths L1 and L2.

When a resistor is formed in an output terminal of a reference voltage circuit, a reference voltage level formed by the reference voltage circuit and a current supplied to the output terminal resistor should be considered. Since a resistance value of the P− poly resistor 2 is greater than that of the P+ poly resistor 3, the output terminal resistor of the reference voltage circuit includes a plurality of P+ poly resistors corresponding to a single P− poly resistor 2. That is, a one-to-many (1:N) relationship is generated between a P− poly resistor and P+ poly resistors that form the resistor of the reference voltage circuit.

The resistor of the reference voltage circuit may include two or more P− poly resistors.

In this case, the number of P+ poly resistors corresponding to a single P− poly resistor is plural, and accordingly one-to-many relationship can be established.

For example, N P+ poly resistors 3 coupled in serial to the P− poly resistor 2 are coupled in series to form an output terminal resistor of the reference voltage circuit.

Figure 3:
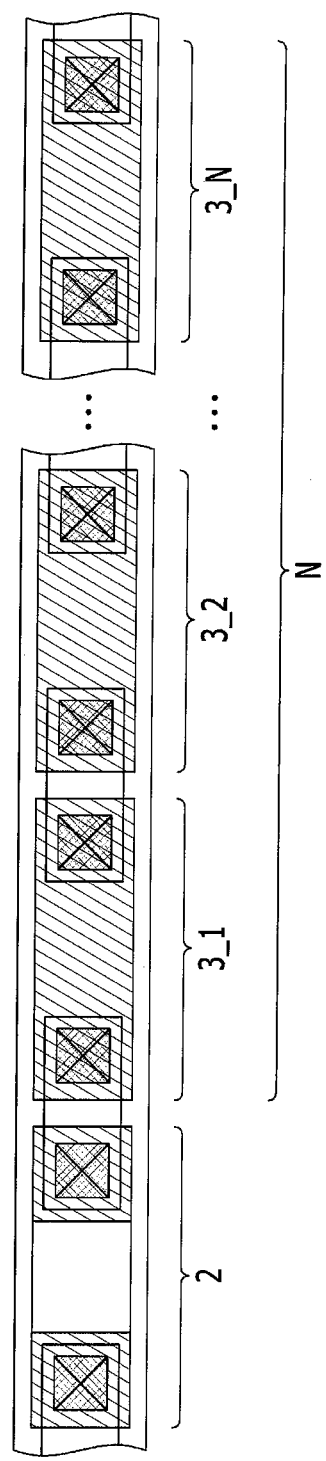
FIG. 3 is a plan view of a resistor connected to an output terminal of a reference voltage circuit.

FIG. 3 is a plan view of a resistor connected to the output terminal of the reference voltage circuit.

As shown in FIG. 3, a P+ poly resistor 3_1 is coupled to the P− poly resistor 2 in series, and a P+ poly resistor 32 is coupled to the P+ poly resistor 3_1 in series. N P+ poly resistors are coupled in series. Hereinafter, the serially coupled N P+ poly resistors are referred to as an N_P+ poly resistor.

Figure 4:
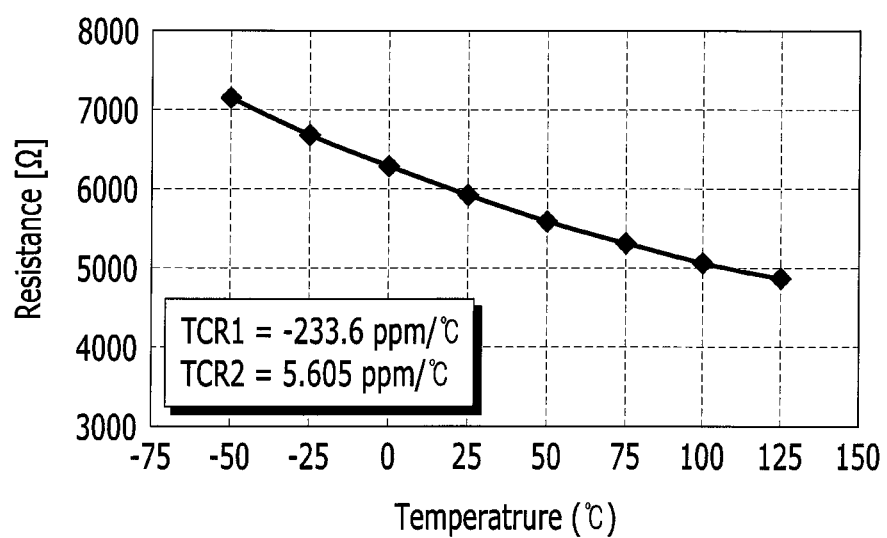
FIG. 4 shows variation of a resistance value according to temperature variation of a P-poly resistor according to the exemplary embodiment of the present invention.

FIG. 4 shows variation of a resistance value according to temperature variation of the P− poly resistor according to the exemplary embodiment of the present invention.

As shown in FIG. 4, resistance of the P− poly resistor 2 is decreased as temperature is increased. A resistance value variation characteristic according to temperature variation is called a temperature characteristic, and a temperature characteristic of the P− poly resistor 2 is a negative characteristic.

Figure 5:
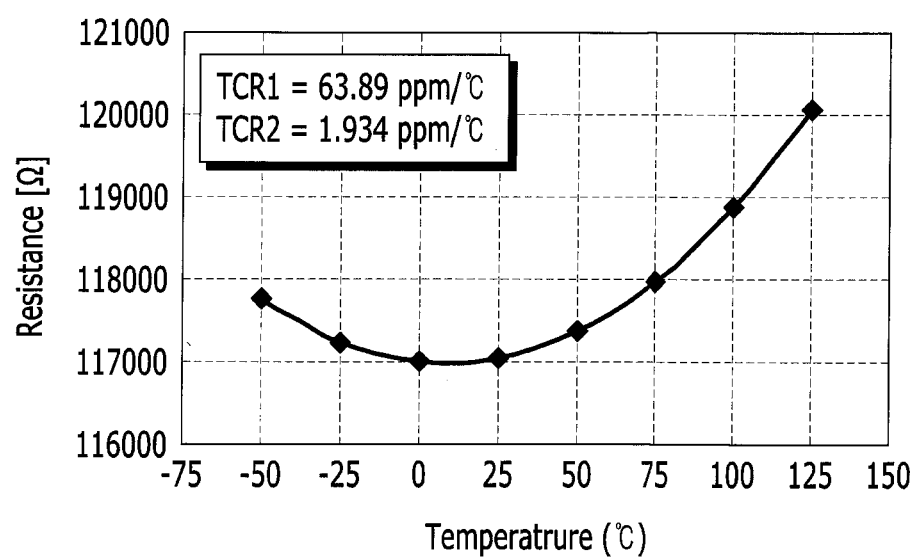
FIG. 5 shows variation of a resistance value according to temperature variation of N_P+ poly resistor according to the exemplary embodiment of the present invention.

FIG. 5 shows resistance value variation of the N_P+ poly resistor according to temperature variation of the N_P+ poly resistor according to the exemplary embodiment of the present invention. A temperature characteristic of the N_P+ poly resistors coupled in series shown in FIG. 3 is shown in FIG. 5.

As shown in FIG. 5, the resistance value of the P+ poly resistor 3 is decreased as temperature is increase before 0° C., and then the resistance value is increased as temperature is increase after 0° C. That is, the temperature characteristic of the P+ poly resistor 3 has a positive characteristic when the temperature is higher than 0° C.

Since the P− poly resistor 1 and the N_P+ poly resistor 3 are coupled in series, a value of the polysilicon resistor 1 can be determined by adding a value of the P− poly resistor 2 and values of the N_P+ poly resistors 3.

The P− poly resistor 2 has a negative temperature characteristic and the N_P+ poly resistor 3 has a positive temperature characteristic, and accordingly the two resistors compensate their temperature characteristics such that variation of the resistance value of the polysilicon resistor 1 that depends on the temperature variation is decreased.

Figure 6:
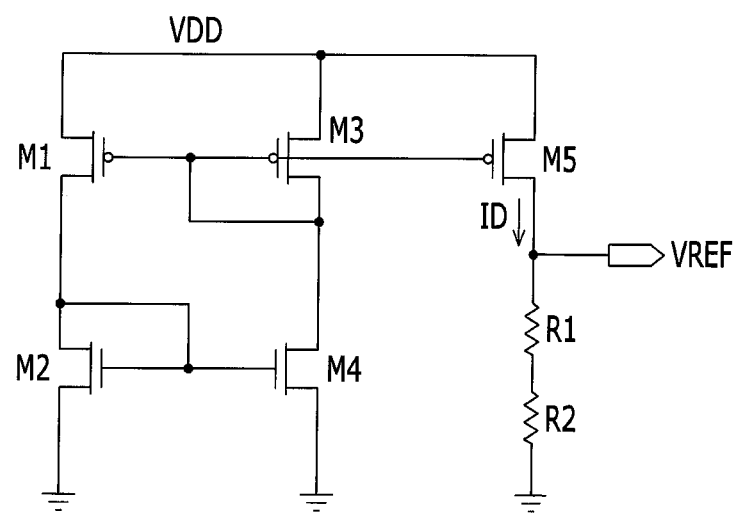
FIG. 6 shows a reference voltage circuit including the P– poly resistor and the N_P+ poly resistor according to the exemplary embodiment of the present invention.

FIG. 6 shows a reference voltage circuit including the P− poly resistor and the N_P+ poly resistor according to the exemplary embodiment of the present invention.

As shown in FIG. 6, the reference voltage circuit includes five transistors M1 to M5 and resistors R1 and R2. The resistor R1 is realized as a P− poly resistor, and the resistor R2 is realized as an N_P+ poly resistor.

Source electrodes of the transistors M1, M3, and M5 are respectively connected to a power source voltage VDD, and gate electrodes of the transistors M1, M3, and M5 are connected with each other. The transistor M3 is diode-connected.

The diode-connected transistor M2 is connected to a drain electrode of the transistor M1, and a gate electrode of the transistor M2 and a gate electrode of the transistor M4 are connected with each other. The drain electrode of the transistor M4 is connected to a drain electrode of the transistor M3.

A first end of the resistor R1 is connected to a drain electrode of the transistor M5, and a second end of the resistor R1 and a first end of the resistor R2 are connected with each other. A voltage of a node where the transistor M5 and the resistor R1 are connected with each other is a reference voltage VREF.

The reference voltage VREF is generated when a drain current ID flowing to the transistor M5 flows to the resistor R1 and the resistor R2.

The reference voltage VREF has a predetermined deviation according to temperature variation, but as previously stated, the deviation is significantly reduced compared to a conventional deviation due to temperature characteristics of the resistors R1 and R2.

Figure 7:
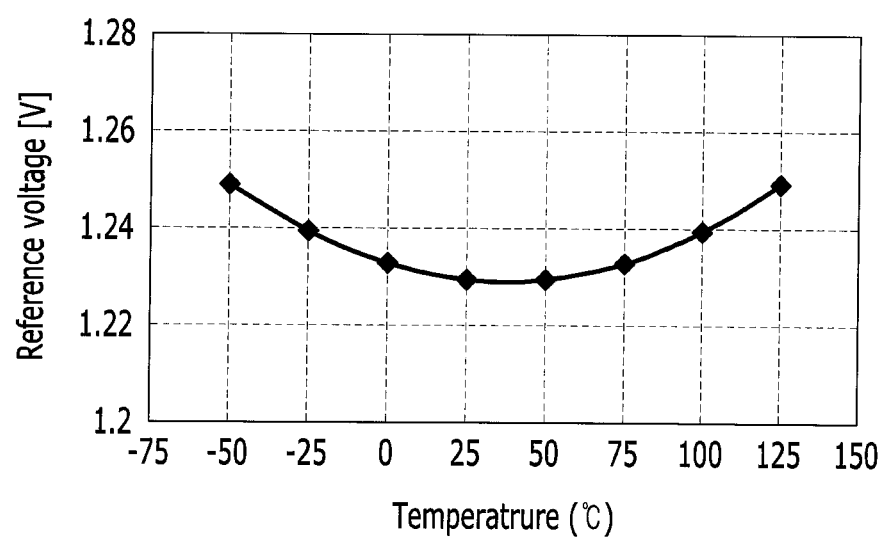
FIG. 7 shows a reference voltage of a reference voltage circuit to which the resistor according to the exemplary embodiment of the present invention is applied.

FIG. 7 shows a reference voltage of a reference voltage circuit to which the resistor according to the exemplary embodiment of the present invention is applied.

As shown in FIG. 7, a reference voltage experiences a voltage deviation of about 20 mV within a temperature range between −50° C. to 125° C. This implies that a variation characteristic of a resistance value of the resistor with respect to temperature variation is significantly improved compared to a conventional resistor.

Figure 8:
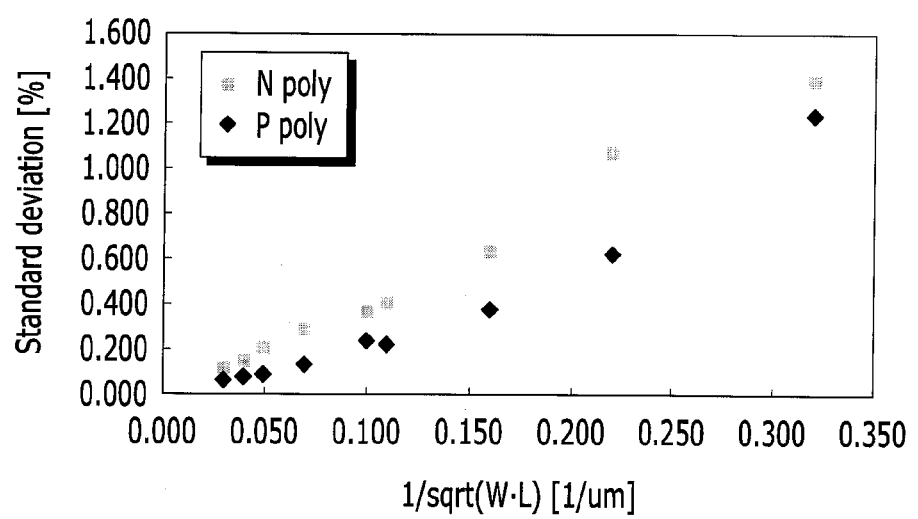
FIG. 8 is a graph illustrating a standard deviation of each area of an n-type polysilicon resistor and an n-type polysilicon resistor.

FIG. 8 is a graph illustrating a standard deviation of each area of an N-type polysilicon resistor and a P-type polysilicon resistor.

In the graph shown in FIG. 8, the vertical axis indicates a standard deviation, and the horizontal axis indicates the reciprocal of the square root of a value that is obtained by multiplying a length L of the resistor and a width W of the resistor, that is, the reciprocal of the square root of the area of the resistor. Thus, the resistor area is decreased toward a direction of the right side of the horizontal axis.

As shown in FIG. 8, the standard deviation according to an area of the P-type polysilicon resistor is smaller than the standard deviation according to an area of the N-type polysilicon resistor.

Thus, a P-type polysilicon resistor has a smaller standard deviation according to an area of the resistor compared to a conventional polysilicon resistor formed of combination of N-type and P-type. The P-type polysilicon resistor has relatively uniform process variation and stabilized characteristic compared to the N-type polysilicon resistor. Thus, a standard deviation of the resistor realized as the P-type polysilicon according to the exemplary embodiment of the present invention can improved.

The gate polysilicon 21 of the P+ poly resistor 3 is described to be wholly doped with the P-type impurities, but the present invention is not limited thereto. The contacts 40 and 41 are formed in an area of the P− poly resistor 2, doped with the P-type impurities, but the present invention is not limited thereto.

As shown in FIG. 4 and FIG. 5, the N_P− poly resistor 2 may have the negative temperature characteristic and the P+ poly resistor 3 may have the positive temperature characteristic by controlling a doping region and an area of the resistor. That is, the doping region may be set to be smaller by changing a doping concentration, and the doping region may be other area than the area where the contacts are formed.

As described, the resistor is formed by serially coupling the P− poly resistor and the P+ poly resistor such that the temperature characteristic of the resistor can be improved compared to a conventional resistor.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS polysilicon resistor 1, P− poly resistor 2, P+ poly resistor 3, substrate 10
metal electrode 11, 12, and 13, gate polysilicon 20 and 21
contact 40, 41, 42, 43
contact hole 30, 31, 32, 33, oxide layer 50 and 51
first insulation layer 60, second insulation layer 70
transistor (M1, M2, M3, M4, M5), resistor R1 and R2

What is claimed is:

1. A polysilicon resistor comprising:
a first polysilicon resistor, and
at least one of second polysilicon resistors coupled to the first polysilicon resistor in series,
wherein the first polysilicon resistor and the at least one of the second polysilicon resistors comprise P-type polysilicon, a doping concentration of the first polysilicon resistor is different from a doping concentration of the at least one of the second polysilicon resistors, and the first polysilicon resistor includes a region that is not doped with P-type impurities.

2. The polysilicon resistor of claim 1, further comprising a substrate and first and second oxide layers formed on the substrate,
wherein the first polysilicon resistor comprises first gate polysilicon formed on the first oxide layer, one of the at least one of the second polysilicon resistors comprises second gate polysilicon formed on the second oxide layer, and an insulating layer is formed between the first and second oxide layers and between the first polysilicon resistor and the at least one of the second polysilicon resistors.

3. The polysilicon resistor of claim 2, wherein a doping concentration of the first gate polysilicon is different from a doping concentration of the second gate polysilicon.

4. The polysilicon resistor of claim 3, wherein an area of the first gate polysilicon, doped with P-type impurities and an area of a region of the second gate polysilicon, doped with the P-type impurities are different from each other.

5. The polysilicon resistor of claim 2, further comprising:
first and second contacts formed on the first gate poly region; and
third and fourth contacts formed on the second gate poly region.

6. The polysilicon resistor of claim 5, wherein the region of the first gate polysilicon, doped with the P-type impurities is a region corresponding to the first and second contacts.

7. The polysilicon resistor of claim 5, further comprising a first metal electrode formed on the second and third contacts and connecting the second contact and the third contact with each other.

8. The polysilicon resistor of claim 7, further comprising:
a second metal electrode formed on the first contact and connected to the first contact; and
a third metal electrode formed on the fourth contact and connected to the fourth contact.

9. The polysilicon resistor of claim 8, wherein the width of the first metal electrode is greater than the width of each of the second and third contacts, the width of the second metal electrode is greater than the width of the first contact, and the width of the third metal electrode is greater than the width of the fourth contact.

10. The polysilicon resistor of claim 1, wherein a temperature characteristic of the first polysilicon resistor and a temperature characteristic of the at least one of the second polysilicon resistors are opposite to each other.

11. A reference voltage circuit comprising:
a transistor connected to a power source voltage and supplying a predetermined current; and
a polysilicon resistor generating a reference voltage according to a current flowing to the transistor,
wherein the polysilicon resistor comprises a first polysilicon resistor and at least one of second polysilicon resistors that is coupled to the first polysilicon resistor in series, the first polysilicon resistor and the at least one of the second polysilicon resistors comprise P-type polysilicon, a doping concentration of the first polysilicon resistor is different from a doping concentration of the at least one of the second polysilicon resistors, and the first polysilicon resistor has a region that is not doped with P-type impurities.

12. The reference voltage circuit of claim 11, wherein a temperature characteristic of the first polysilicon resistor and a temperature characteristic of the at least one of the second polysilicon resistors are opposite to each other.

* * * * *